(12) United States Patent
Pittau

(10) Patent No.: US 6,282,149 B1
(45) Date of Patent: Aug. 28, 2001

(54) CIRCUIT AND METHOD FOR SYNCHRONIZED DATA BANKING

(75) Inventor: John K. Pittau, Corona, CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/448,027

(22) Filed: Nov. 23, 1999

(51) Int. Cl.$^7$ .................................................. G11C 7/00
(52) U.S. Cl. ..................... 365/233; 365/230.03; 345/100; 345/197
(58) Field of Search ........................... 365/233, 189.05, 365/189.02, 230.03, 230.02; 345/100, 197

Primary Examiner—Vu A. Le
(74) Attorney, Agent, or Firm—Martine & Penilla, LLP

(57) ABSTRACT

Disclosed is a circuit and a method for synchronizing data communication using a set of storage banks. The circuit includes enable circuitry and synchronization circuitry. The enable circuitry generates a set of enable signals to select a storage bank that has completed receiving the data for storage and to sequentially select the storage banks for transmitting the stored data. The synchronization circuitry synchronizes the selection of a storage bank to receive and store the data with the generation of the enable signals to transmit the stored data, wherein the synchronization circuitry selects the storage banks sequentially one after another.

18 Claims, 6 Drawing Sheets

US 6,282,149 B1

CIRCUIT AND METHOD FOR SYNCHRONIZED DATA BANKING

BACKGROUND OF THE INVENTION

1. Field of the Invention

The present invention relates generally to data communication circuits, and more particularly to a circuit and method for synchronizing data communication using a set of storage banks.

2. Description of the Related Art

Modern computer systems generally include one or more memory units such as random-access-memory (RAM), read-only-memory (ROM), FIFOs, etc. The memory units store data and instructions for use by a processor, which is coupled to the memory units via a memory bus. In communicating data and instructions, data capture devices such as toggle synchronizers are routinely used to synchronize communication between two devices having different data throughput rates. These data capture devices receive data from one device at one speed and store the data into FIFOs or register files. The stored data are then transmitted to the other device at a speed optimized for the latter device.

FIG. 1 shows a block diagram of a conventional computer system 100 including a processor 102 and a chip containing a memory device 104. The chip containing the memory device 104 is coupled to the processor 102 and includes a buffer circuit 108 and a memory unit 114. The memory unit 114 may be a random access memory (RAM) in the form of an internal register file. The buffer circuit 108 receives and buffers data for synchronized data transmission between the processor 102 and the memory unit 114. To perform I/O operations, the processor 102 typically generates and transmits read/write control signals 112 (e.g., address, data, enable, etc.) to the chip with memory device 104. For example, in read operations, the memory device 104 fetches data from the memory unit 114 and stores the data in the buffer circuit 108. The requested data in the buffer circuit 108 are then transmitted to the processor 102 for processing.

In general, however, since the processor 102 can process data at a much faster rate than the memory device 104 is capable of operating, the memory device 104 often transmits a NOT_READY signal 110 to indicate that data is currently unavailable in the buffer circuit 108. In response, the processor 102 stops initiating read/write operations and may perform other tasks while the NOT_READY signal 110 is asserted. When the requested data has been fetched into the buffer circuit 108, the memory device 104 de-asserts the NOT_READY signal and provides the data to the processor 102.

Unfortunately, however, the assertion of NOT_READY signals generally degrades performance of the computer system 100 by interrupting read/write operations. This is because the processor 102 must switch from performing one task to another task and then switch back to the original interrupted task when data becomes available. Furthermore, the interruption not only delays the interrupted read/write task but also all subsequent read/write operations. This means that the processor 104 is not efficiently utilized since the memory device 104 stops further read/write operations by the processor 102 until the interrupted read/write operation is completed. Thus, the interruption in such read/write operations may cause a bottleneck limiting the performance of high-speed successive read/write operations. By way of example, disk drive controllers 104 are often called upon by the processor 102 to perform many read/write operations to or from FIFOs. In such situations, interruptions in read/write operations delay the access of disk drive controller and thus slow down the response times of computer systems in general.

In view of the foregoing, there is a need for a circuit and method that can transmit data between devices having different data throughput rates without interruption.

SUMMARY OF THE INVENTION

The present invention fills this need by providing a method and a circuit for transmitting data between devices having different data throughput rates without interruption. The present invention can be implemented in numerous ways, including as a process, an apparatus, a system, a device, or a method. Several embodiments of the present invention are described below.

In accordance with a first aspect of the invention, the present invention provides a circuit for synchronizing data communication. The circuit includes enable circuitry, a set of storage banks, and synchronization circuitry. The storage banks receive and store data for transmission. The enable circuitry generates a set of enable signals to select a storage bank that has completed receiving the data for storage, i.e., FIFO, and to sequentially select the storage banks for transmitting the stored data. The synchronization circuitry synchronizes the selection of a storage bank to receive and store the data with the generation of the enable signals to transmit the stored data, wherein the synchronization circuitry selects the storage banks sequentially one after another. In this manner, the synchronization circuitry synchronizes the asynchronous READ strobe from a processor to a storage device.

In accordance with a second aspect of the invention, the present invention provides an interface circuit for synchronously transmitting data from a first device to a second device. The interface circuit includes a set of storage banks, a multiplexer, enable circuitry, and synchronization circuitry. The set of storage banks is configured to receive and store data with each storage bank being configured to transmit the stored data. The multiplexer is coupled to receive the stored data and a set of enable signals and selects a storage bank in response to the set of enable signals. In so doing, the multiplexer transmits the stored data for output. The enable circuitry is configured to generate the set of enable signals for sequentially selecting a storage bank that has completed receiving the data. The enable signals are used to sequentially select the storage banks for transmitting the stored data. The synchronization circuitry is configured to synchronize the selection of a storage bank to receive and store the data with the generation of the enable signals to transmit the stored data, wherein the synchronization circuitry selects the storage banks sequentially one after another.

In accordance with a third aspect of the invention, the present invention provides a method for synchronously transmitting data from a first device to a second device. The method includes (a) receiving and storing data in a set of storage banks, each storage bank including a plurality of storage cells, the storage banks being configured to transmit the stored data; (b) generating a set of enable signals to select a storage bank that has completed receiving the data for storage, the set of enable signals being adapted to sequentially select the storage banks for transmitting the stored data; (c) transmitting the stored data from the selected storage bank for output in response to the set of enable signals; and (d) sequentially synchronizing the selection of a storage bank to receive and store the data with the transmission of the stored data such that when one storage bank is receiving and storing the data, the stored data from another storage bank is transmitted.

Benefits and advantages of the present invention include a higher rate of data communication from the synchronizing the reception and transmission of data. In addition, the higher data transmission rate eliminates the need for generating and transmitting NOT_READY signals to the processor. This allows more efficient use of the processor by reducing wait states in transferring data. In contrast, in the case of a microprocessor reading from a chip that has a FIFO, conventional techniques have asserted NOT-READ signal between consecutive reads to allow the internal circuit to increment the pointers of the FIFO as a result of READ strobe being asserted and synchronized. Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

The present invention provides a circuit and a method for transmitting data between devices having different data throughput rates by synchronizing data communication using a set of storage banks. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
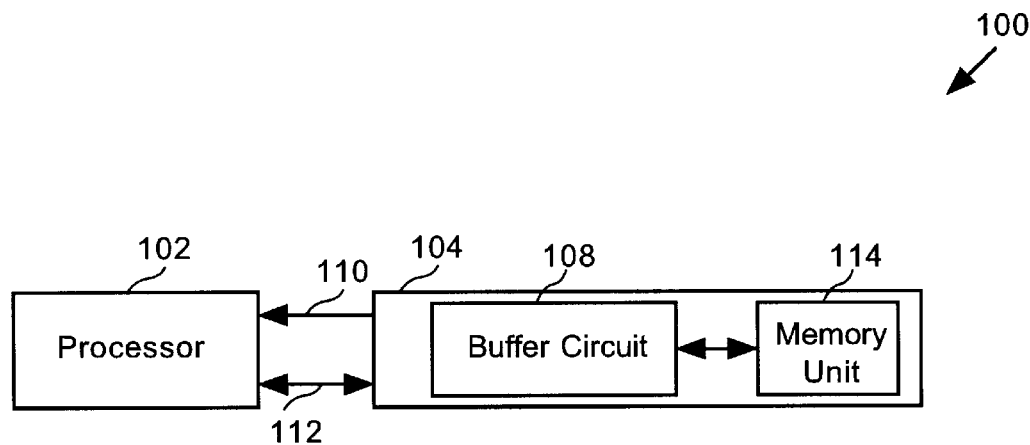
FIG. 1 shows a block diagram of a conventional computer system including a processor and a memory device.
Figure 2:
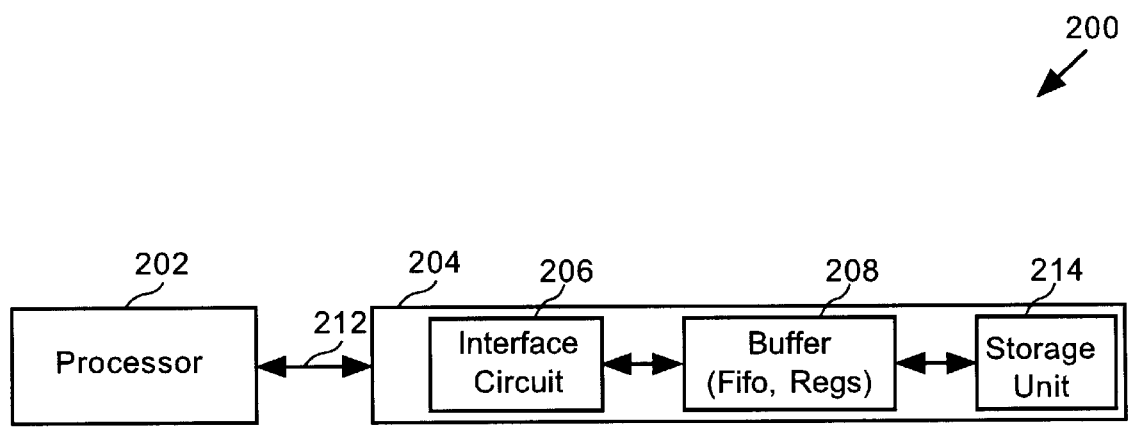
FIG. 2 shows a block diagram of a computer system including a processor and a storage device, according to one embodiment of the invention.

FIG. 2 shows a block diagram of a computer system 200 including a processor 202 and a storage device 204 according to one embodiment of the invention. The storage device 204 is coupled to the processor 202 and includes an interface circuit 206, a buffer 208, and a storage unit 214. The storage unit 214 stores information such as data and instructions and may be a random access memory (e.g., DRAM, SRAM, SDRAM, etc.), a disk drive memory, an optical memory, a tape drive, or other suitable storage device.

The buffer 208 is configured to store data from the storage unit 214 for synchronized data transmission between the processor 202 and the storage unit 214. When the processor 202 generates and transmits read signals 212 (e.g., address, read strobe, address latch enable, etc.) to the storage device 204, the buffer 208 synchronously receives and buffers the requested data from the storage unit 214. In one embodiment, the buffer 208 is implemented using a first-in-first-out (FIFO) buffer. Alternatively, the buffer 208 may be implemented using a register file that includes a set of registers. The data from the buffer 208 is then transmitted to the processor 202 via the interface circuit 206.

Figure 3:
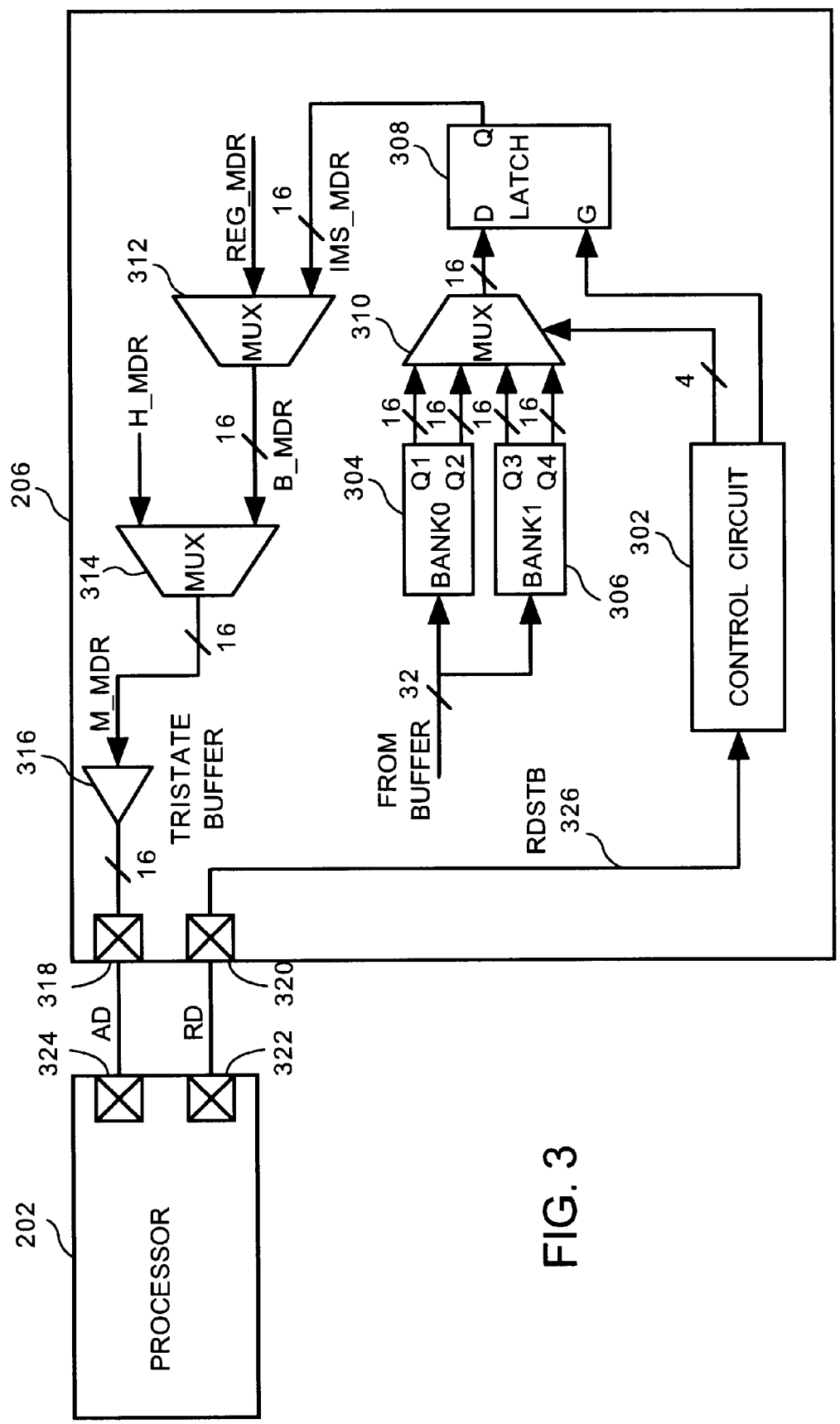
FIG. 3 shows a more detailed block diagram of an interface circuit for synchronizing communication with the processor in accordance with one embodiment of the invention.

FIG. 3 shows a more detailed block diagram of the interface circuit 206 for synchronizing communication with the processor 202 in accordance with one embodiment of the invention. The interface circuit 206 includes control circuitry 302, banks 304 and 306, multiplexers (MUX) 310, 312, and 314, a latch 308, a tri-state buffer 316, and I/O pads 318 and 320. The processor 202 generates and communicates control signals from a pad 322 to a pad 320 of the interface circuit 206. For example, for reading data from the storage unit 208, the processor 202 generates and transmits read control signals such as address signals and a read strobe signal. The control circuitry 302 receives a read strobe signal RDSTB 326 from the processor 202 for synchronizing data communication.

It should be noted that the interface circuit 206 may include any suitable number of banks to store and transmit data between the buffer 208 and the processor 202. As will be described in more detail below, each of the storage banks 304 and 306 is further partitioned into a number of storage banks, preferably a pair of storage banks. In such an embodiment, the bank 304 outputs the content of the pair of storage banks via output port Q1 and Q2, respectively. Likewise, the bank 306 transmits the content of its storage banks via output port Q3 and Q4, respectively.

In this arrangement, when the data has been fetched into the buffer 208, the control circuitry 302 selects one of the storage banks to receive and store the data in the selected storage bank. Additionally, the control circuitry 302 generates a set of enable signals for selecting one of the storage banks for transmitting the stored data. Specifically, the set of enable signals are provided as control signals to the MUX 310, which sequentially selects a storage bank that has completed receiving data for storage. Furthermore, the control circuitry 302 synchronizes the selection of a storage bank to receive and store the data with the generation of the enable signals to transmit the stored data by selecting the storage banks sequentially one after another.

When the MUX 310 outputs data from a selected storage bank, the latch 308 latches the output data and outputs the latched data (IMS_MDR), which is input into the MUX 312. As shown in this embodiment, the term IMS is used to refer to inbound message from the buffer 208, which may be a FIFO or a register file. The MUX 312 receives the output IMS_MDR of the latch 308 and data REG_MDR from one or more registers (not shown) and transmits one of the input data for output as B_MDR. The MUX 314 receives the output B_MDR and data H_MDR from one or more registers such as a host block register file (not shown). The MUX 314 then selectively outputs one of the input data as output data M_MDR, which is input to the tri-state buffer 316. The tri-state buffer 316 feeds the output data M_MDR to pad 318 for transmission to a pad 324 of processor 202.

Figure 4:
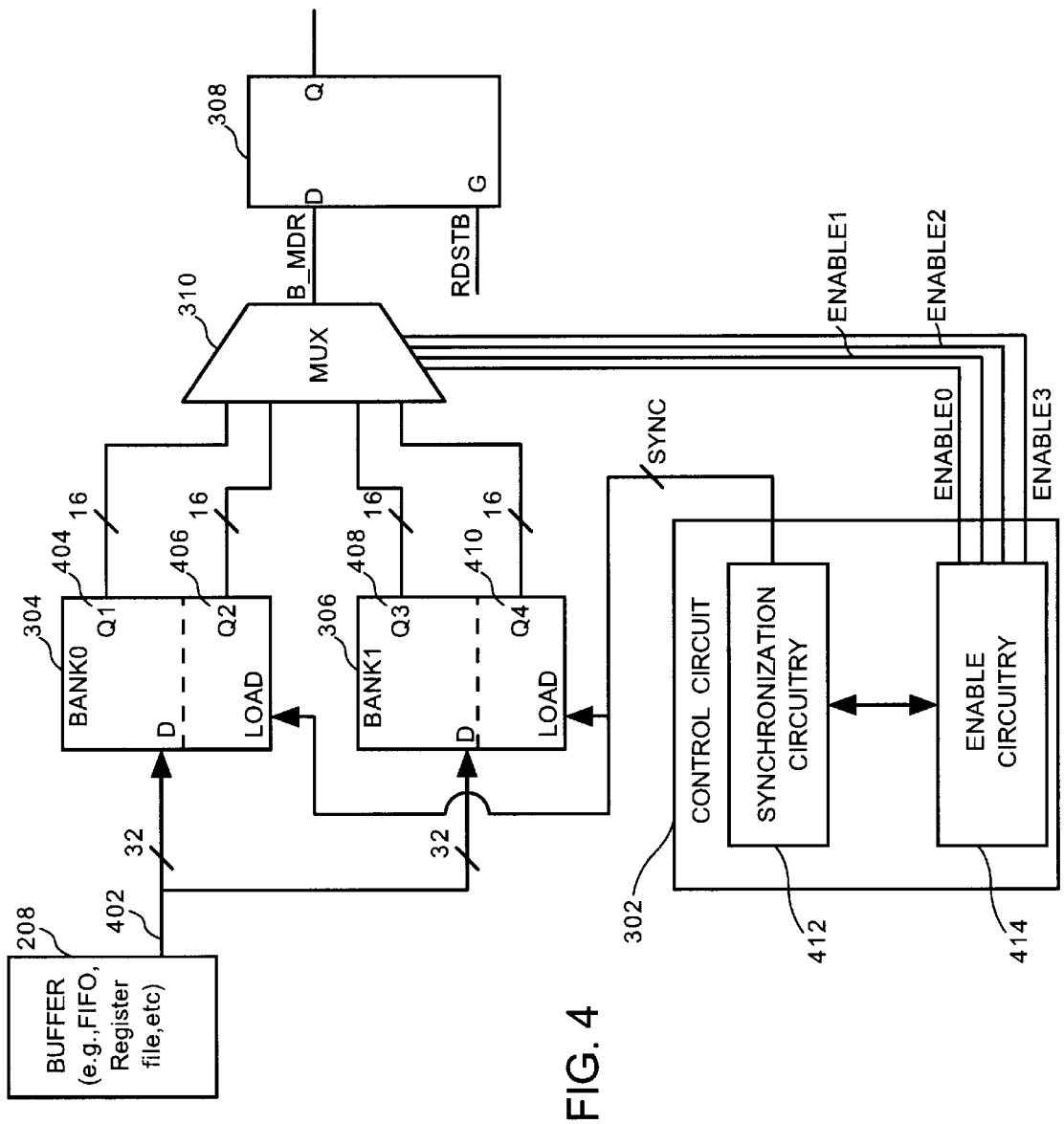
FIG. 4 illustrates a more detailed block diagram of the interface circuit for showing the selection of the storage banks in accordance with one embodiment of the present invention.

FIG. 4 illustrates a more detailed block diagram of the interface circuit 206 for showing the selection of the storage banks in accordance with one embodiment of the present invention. In this embodiment, the buffer 208 provides a 32-bit data to data banks 304 and 306 over a 32-bit bus 402. Each of the data banks 304 and 306 is partitioned into a pair of storage banks with 16-bit outputs. Specifically, the data bank 304 includes storage banks 404 and 406 with output ports Q1 and Q2, respectively, for outputting data to the MUX 310. On the other hand, the data bank 306 contains storage banks 408 and 410 with output ports Q3 and Q4, respectively, for providing data to the MUX 310.

The MUX 310 receives the data from the storage banks 404, 406, 408, and 410 and selects one of the storage banks 404, 406, 408, and 410 in response to a set of enable signals ENABLE0, ENABLE1, ENABLE2, and ENABLE3 from the control circuit 302. The control circuit 302 includes synchronization circuitry 412 and enable circuitry 414 for synchronizing data communication. The enable circuitry 414 generates the enable signals for sequentially selecting a storage bank that has completed storing the data for transmitting the stored data. The synchronization circuitry 412 is in communication with the enable circuitry 414 and is configured to generate synchronization signals SYNC to synchronize the selection of a storage bank for receiving and storing the data with the generation of the enable signals to transmit the stored data. Preferably, the SYNC signals are also used to increment the address pointers of FIFO 208.

The synchronization circuitry 412 and the enable circuitry 414 operate to sequentially store and transmit data from the storage banks over a series of cycles as shown in the following Table 1, where SB refers to a storage bank and X refers to a "don't care" state.

TABLE 1

|        | Cycle 1 | Cycle 2 | Cycle 3 | Cycle 4 | Cycle 5 | Cycle 6 |
|--------|---------|---------|---------|---------|---------|---------|
| SB 404 | load    | filled  | transmit| X       | load    | filled  |
| SB 406 | X       | load    | filled  | transmit| X       | load    |
| SB 408 | X       | X       | load    | filled  | transmit| X       |
| SB 410 | X       | X       | X       | load    | filled  | transmit|

As shown in Table 1, the synchronization circuitry 412 selects the storage bank 404 for loading data from the buffer 208 during the first read cycle. Then, the storage bank 406 is selected for loading data from the buffer 208 in the next read cycle. In the next read cycle, the synchronization circuitry 412 selects the storage bank 408 for loading data while the enable circuitry 414 selects the previously filled storage bank 404 for transmitting data. Similarly, during the next read cycle, the synchronization circuitry 412 selects the storage bank 410 for loading, while enable circuitry 414 selects the previously filled storage bank 406. This process continues in this manner in a loop.

As can be appreciated, the continuous loading and transmitting of data using bank switching avoids the need for the assertion of NOT_READY signals that have interrupted conventional read operations. This is because the interface circuit 206 is synchronized to transfer data through buffer 208 between storage unit 214 and processor 202 without requiring processor 202 to wait or switch between tasks when data becomes available. In addition, the lack of waiting and task switching by the processor 202 not only speeds up the read task, but also accelerates subsequent read operations. This allows the processor 202 to be more efficiently utilized, since the storage device 204 does not stop further read operations by the processor 202 until the earlier read operation is completed. Thus, read operation wait states or interrupts no longer limit the performance of high-speed successive read operations.

Figure 5A:
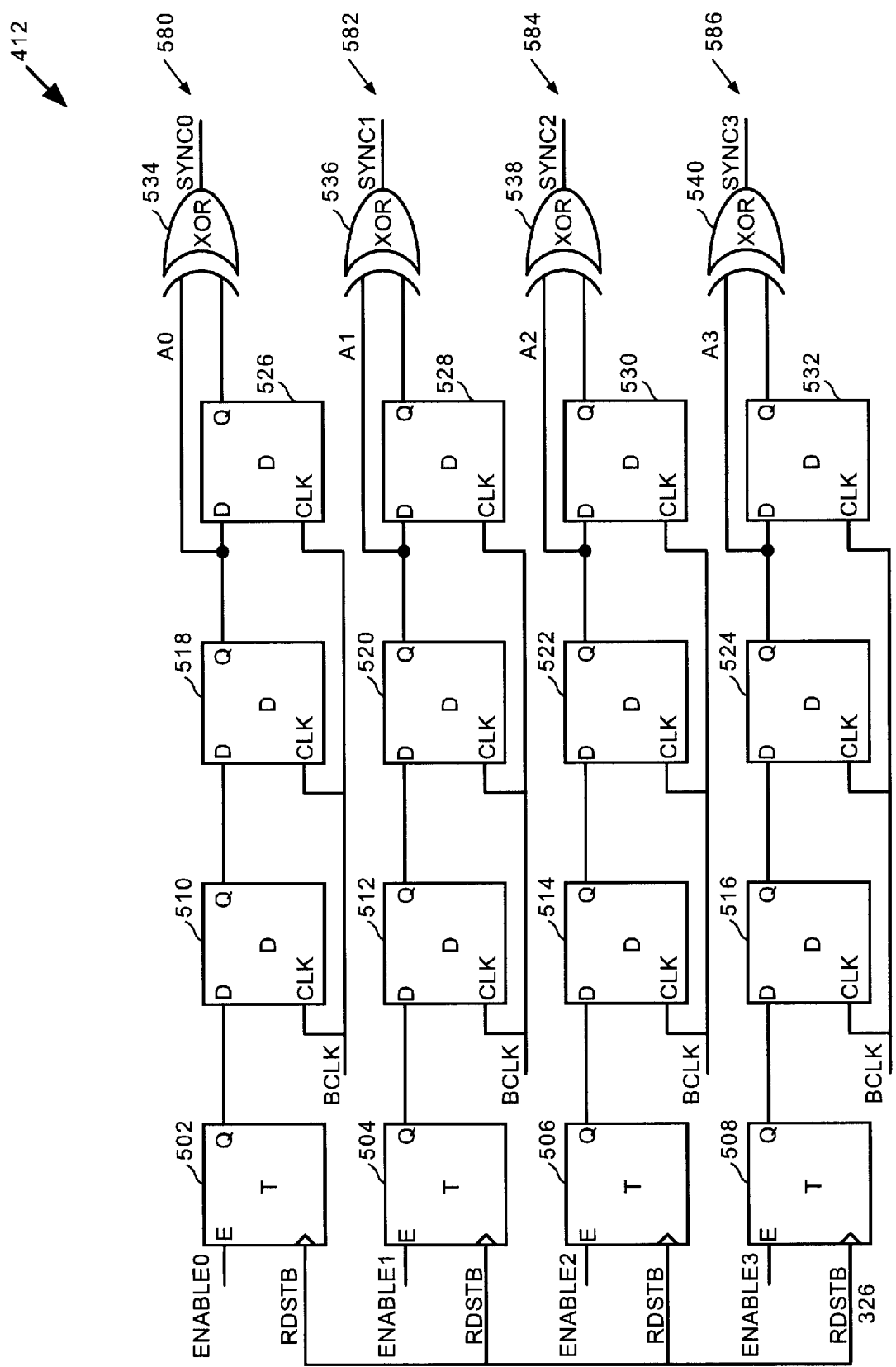
FIG. 5A shows a more detailed circuit diagram of the synchronization circuitry in accordance with one embodiment of the present invention.

FIG. 5A shows a more detailed circuit diagram of the synchronization circuitry 412 in accordance with one embodiment of the present invention. The synchronization circuitry 412 includes a plurality of synchronization sub-circuits 580, 582, 584, and 586. Each of the synchronization sub-circuits 580, 582, 584, and 586 includes a plurality of flip-flops and an EXCLUSIVE-OR (XOR) gate. The synchronization sub-circuit 580 includes flip-flops 502, 510, 518, and 526, and an XOR gate 534; the synchronization sub-circuit 582 includes flip-flops 504, 512, 520, and 528, and an XOR gate 536; the synchronization sub-circuit 584 includes flip-flops 506, 514, 522, and 530, and an XOR gate 538; and the synchronization sub-circuit 586 includes flip-flops 508, 516, 524, and 532, and an XOR gate 540. In a preferred embodiment, the flip-flops 502, 504, 506, and 508 are implemented as Toggle (T) flip-flops while the other flip-flops are implemented using D flip-flops. However, other suitable flip-flops may also be used in the synchronization circuitry 412.

Each of the synchronization sub-circuits 580, 582, 584, and 586 is configured to receive one of the enable signals and the read strobe signal RDSTB 326 as inputs to generate a synchronization signal. Specifically, the synchronization sub-circuits 580, 582, 584, and 586 receive enable signals ENABLE0, ENABLE1, ENABLE2, and ENABLE3, respectively, for generating synchronization signals SYNC0, SYNC1, SYNC2, and SYNC3, respectively.

For example, the synchronization sub-circuit 580 receives an enable signal ENABLE0 and an RDSTB signal as inputs to the T flip-flop 502. The output of the T flip-flop 502 along with a buffer clock BCLK is provided to the D flip-flop 510. In turn, the D flip-flop 510 feeds an output signal to the D flip-flop 518, which is clocked by the BCLK. The D flip-flop 518 outputs a signal A0 that is fed into the D flip-flop 526, which also receives the buffer clock BCLK. The XOR gate 534 receives the signal A0 from the D flip-flop 518 and the output of the D flip-flop 526 and generates an XORed result, which is output as the synchronization signal SYNC0.

As shown, the other synchronization sub-circuits 582, 584, and 586 operate in a similar manner to generate the synchronization signals SYNC1, SYNC2, and SYNC3, respectively. For example, D flip-flops 520, 522, and 524 generate logic signal outputs A1, A2, and A3, respectively, which are provided to XOR gates 536, 538, and 540, respectively. As will be discussed in more detail below, the generated signals A0, A1, A2, and A3 are also provided to the enable circuitry 414. In addition, the outputs of D flip-flops 528, 530, and 532 are provided as inputs to XOR gates 536, 538, and 540, respectively for generating synchronization signals SYNC1, SYNC2, and SYNC3, respectively. The synchronization signals SYNC0, SYNC1, SYNC2, and SYNC3 are used as control signals to load data in the 16 bit storage banks contained in BANK0 304 and BANK1 306.

Figure 5B:
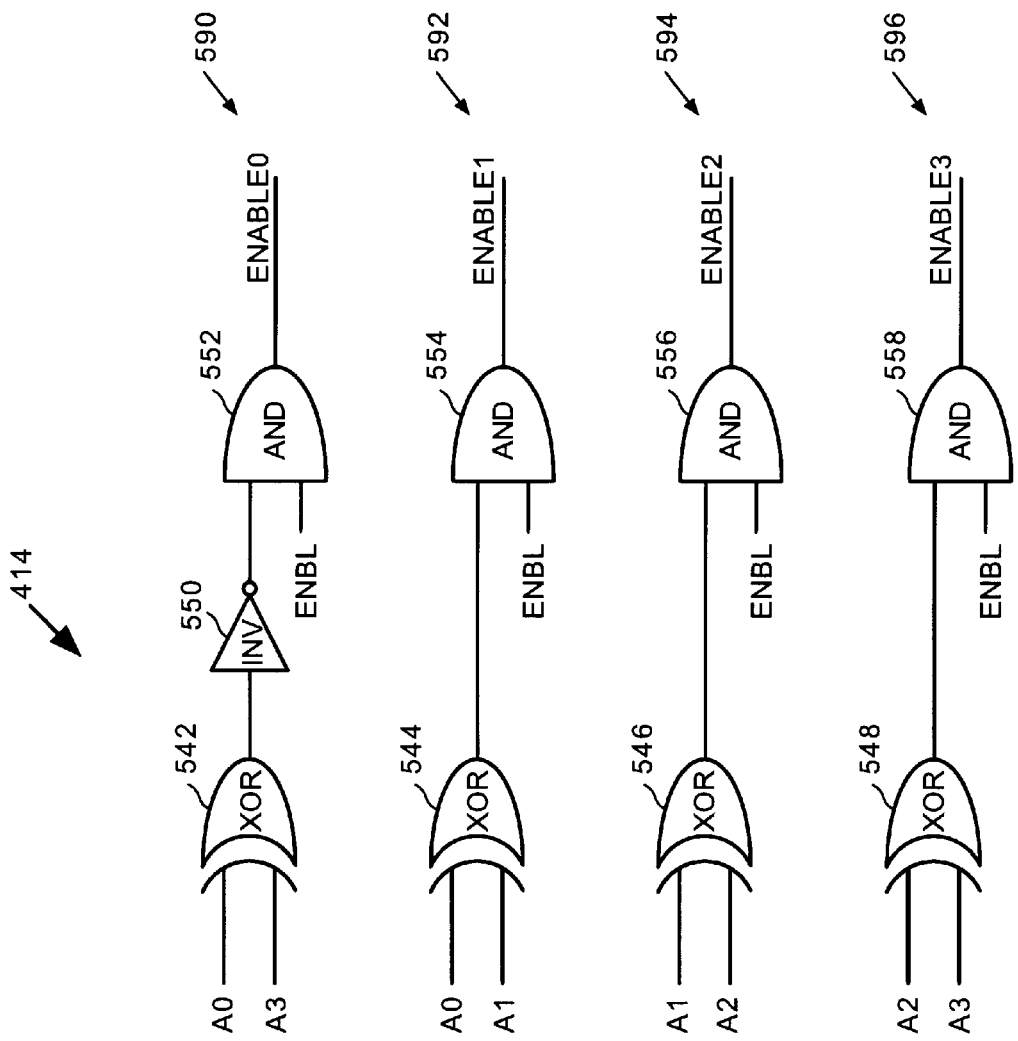
FIG. 5B shows a more detailed circuit diagram of the enable circuitry in accordance with one embodiment of the present invention.

FIG. 5B shows a more detailed circuit diagram of the enable circuitry 414 in accordance with one embodiment of the present invention. The enable circuitry 414 includes a plurality of enable sub-circuits 590, 592, 594, and 596 for generating the enable signals ENABLE0, ENABLE1, ENABLE2, AND ENABLE3, respectively, using logic equations as shown in the following Table 2:

TABLE 2

|  | Enable signal | Logic Equation |
| --- | --- | --- |
| enable sub-circuit 590 | ENABLE0 | ENBL AND NOT(A0 XOR A3) |
| enable sub-circuit 592 | ENABLE1 | ENBL AND (A0 XOR A1) |
| enable sub-circuit 594 | ENABLE2 | ENBL AND (A1 XOR A2) |
| enable sub-circuit 596 | ENABLE3 | ENBL AND (A2 XOR A3) |

As shown in Table 2, each of the enable sub-circuits 590, 592, 594, and 596 receives a pair of signals selected from A0, A1, A2, and A3. By way of example, the enable sub-circuit 590 includes an XOR gate 542, an inverter 550, and an AND gate 552. The XOR gate 542 receives logic signals A0 and A3 as inputs and performs an XOR operation. The XOR gate 542 then provides the XORed result to the inverter 550, which outputs an inverted XORed result. The output of the inverter 550 is then provided to the AND gate 552, which also receives an ENBL signal as another input. The AND gate 552 performs an AND operation to generate the enable signal ENABLE0.

The ENBL is an optional signal that indicates a full buffer, a latched memory address, and a selection of the integrated circuit chip, which contains the control circuitry 302. For purposes of the present invention, the ENBL signal is assumed to be a logical value of "1." In such cases, the AND gates 552, 554, 556, and 558 are also optional.

The enable sub-circuits 592, 594, and 596 also receive a pair of signals selected from the A0, A1, A2, and A3 signals for generating the enable signals ENABLE1, ENABLE2, and ENABLE3, respectively. The enable sub-circuit 592 includes an XOR gate 544 and an AND gate 554; the enable sub-circuit 594 includes an XOR gate 546 and an AND gate 556; and the enable sub-circuit 596 includes an XOR gate 548 and an AND gate 558. The XOR gate 544 receives A0 and A1 signals as inputs and performs an XOR operation. The result of the XOR operation is then fed into the AND gate 554 as an input. The AND gate 554 also receives an ENBL signal "1" and performs an AND operation on the inputs. The result of the AND operation is then output as ENABLE1 signal.

As shown, the other enable sub-circuits 594 and 596 operate in a similar manner to generate the enable signals ENABLE2 and ENABLE3, respectively. For example, the XOR gate 546 of the enable sub-circuit 594 receives A1 and A2 signals as inputs while the XOR gate 548 of the enable sub-circuit 596 receives A2 and A3 signals as inputs. Thus generated enable signals ENABLE0, ENABLE1, ENABLE2, and ENABLE3 are provided as inputs to the T flip-flops 502, 504, 506, and 508 of the four synchronizer sub-circuits 580, 582, 584, and 586.

The operation of the sub-circuits shown in FIGS. 5A and 5B will now be discussed in accordance with one embodiment of the present invention. Initially, all the flip-flops of the synchronizer sub-circuits 580, 582, 584, and 586 are configured to output a value of "0." For the enable sub-circuit 590, the input signals A0 and A3 are both "0s" at this time. Thus, the XOR gate 542 generates an output "0" and the inverter 550 outputs an inverted value of "1." Then, in response to the input from the inverter 550 and ENBL signal (assumed to be "1"), the AND gate 552 generates a value of "1" as ENABLE0. On the other hand, the enable sub-circuits 592, 594, and 596 generate "0s" for the enable signals ENABLE1, ENABLE2, and ENABLE3, respectively, due to the absence of an inverter. The assertion of the enable signal ENABLE0 activates the T flip-flop 502 in the synchronizer sub-circuit 580. In this state, when the RDSTB signal 326 is asserted, the T flip-flop 502 produces a value of "1," which propagates through the D flip-flops 510, 518, and 526 at each BCLK clock cycle.

When the D flip-flop 518 propagates an output value of "1," which is provided to the XOR gate 534 as the A0 signal, the XOR gates 542 and 544 generate an output of "1." Since the XOR gate 542 output is inverted by inverter 550 and the XOR gate 544 output is not inverted, the AND gate 552 generates a value of "0" for ENABLE0 while the AND gate 554 produces a value of "1" as ENABLE1. At this time, the signals ENABLE2 and ENABLE3 remain de-asserted (e.g., "0"). Therefore, only ENABLE1 is asserted, thereby enabling the T flip-flop 504. In this enabled state, when the RDSTB signal 326 is asserted, the T flip-flop 504 produces a value of "1," which propagates through the D flip-flops 512, 520, and 528 at each BCLK clock cycle. After the D flip-flop 520 outputs a value of "1" as signal A1, the XOR gate 536 generates a value of "1" in response. After another BCLK clock cycle, when the D flip-flop 528 outputs a value of "1" such that the XOR gate 536 generates a value of "0" in response.

After signal A1 becomes "1," the XOR gates 542 and 546 generate an output of "1." Since the output of XOR gate 542 is inverted by inverter 550 while the output of XOR gate 546 is not inverted, the AND gate 552 generates an ENABLE0 value of "0" and the AND gate 556 generates an ENABLE2 value of "1." The enable signals ENABLE1 and ENABLE3 remain "0." Therefore, only ENABLE2 is asserted, thereby enabling the T flip-flop 506. In this state, when the RDSTB signal 326 is asserted, the T flip-flop 506 produces a value of "1," which propagates through the D flip-flops 514, 522, and 530 at each BCLK clock cycle. In response to an output value of "1" (i.e., signal A2) from D flip-flop 522, the XOR gate 538 generates a value of "1." After another BCLK clock cycle, the D flip-flop 530 propagates a value of "1" so that the XOR gate 538 generates a value of "0."

After signal A2 becomes "1," the XOR gates 542 and 548 generate an output of "1." Since the output of XOR gate 542 is inverted by inverter 550, and the output of XOR gate 548 is not inverted, the AND gate 552 generates an enable signal ENABLE0 output of "0" and the AND gate 558 generates an enable signal ENABLE3 output of "1." The enable signals ENABLE1 and ENABLE2 remain "0." Therefore, only ENABLE3 has a value of "1," which enables T flip-flop 508. In this state, when the RDSTB signal 326 is asserted, the T flip-flop 508 produces a value of "1," which propagates through the D flip-flops 516, 524, and 532 at each BCLK clock cycle. After the D flip-flop 524 output (i.e., signal A3) propagates a value of "1," the XOR gate 540 generates a value of "1." After another BCLK clock cycle, the D flip-flop 532 outputs a value of "1" so that the XOR gate 540 produces a value of "0."

Eventually, each of the T flip-flops 502, 504, 506, and 508 produces an output of "1," which is propagated to produce signals A0, A1, A2, and A3. The signals A0, A1, A2, and A3 each having a value of "1" are fed as inputs to the XOR gates 542, 544, 546, and 548, which generate "0" outputs. The inverter 550 inverts the output of XOR gate 542 to output a value of "1." The output of the inverter 550, and the outputs of the XOR gates 544, 546, and 548 are inputs to the AND gates 552, 554, 556, and 558, respectively. The AND gates 552, 554, 556, and 558 also receive an ENBL signal of "1." Thus, the AND gate 552 generates a value of "1" for ENABLE0 while the AND gates 554, 556, and 558 produce "0s" for ENABLE1, ENABLE2, and ENABLE3.

After each of the flip-flops shown in FIG. 5A propagates an output of "1," it will then sequentially propagate an output of "0" in a manner similar to the propagation of the output of "1." For example, when ENABLE0 and the RDSTB signal 326 are asserted, the T flip-flop 502 in the synchronizer sub-circuit 580 produces an output of "0," which propagates through the D flip-flops 510, 518, and 526 at each BCLK clock cycle. When the D flip-flop 518 produces an output of "0" (i.e., signal A0) the XOR gate 534 generates a value of "1" in response. After another BCLK clock cycle, the output of D flip-flop 526 feeds a value of "0" to the XOR gate 534, which generates a value of "0" in response. The other synchronizer sub-circuits 582, 584, and 586 operate in a similar manner to implement the functions previously described in Table 1. In this arrangement, one and only one of the enable signals ENABLE0, ENABLE1, ENABLE2, and ENABLE3 will be sequentially asserted.

Figure 6:
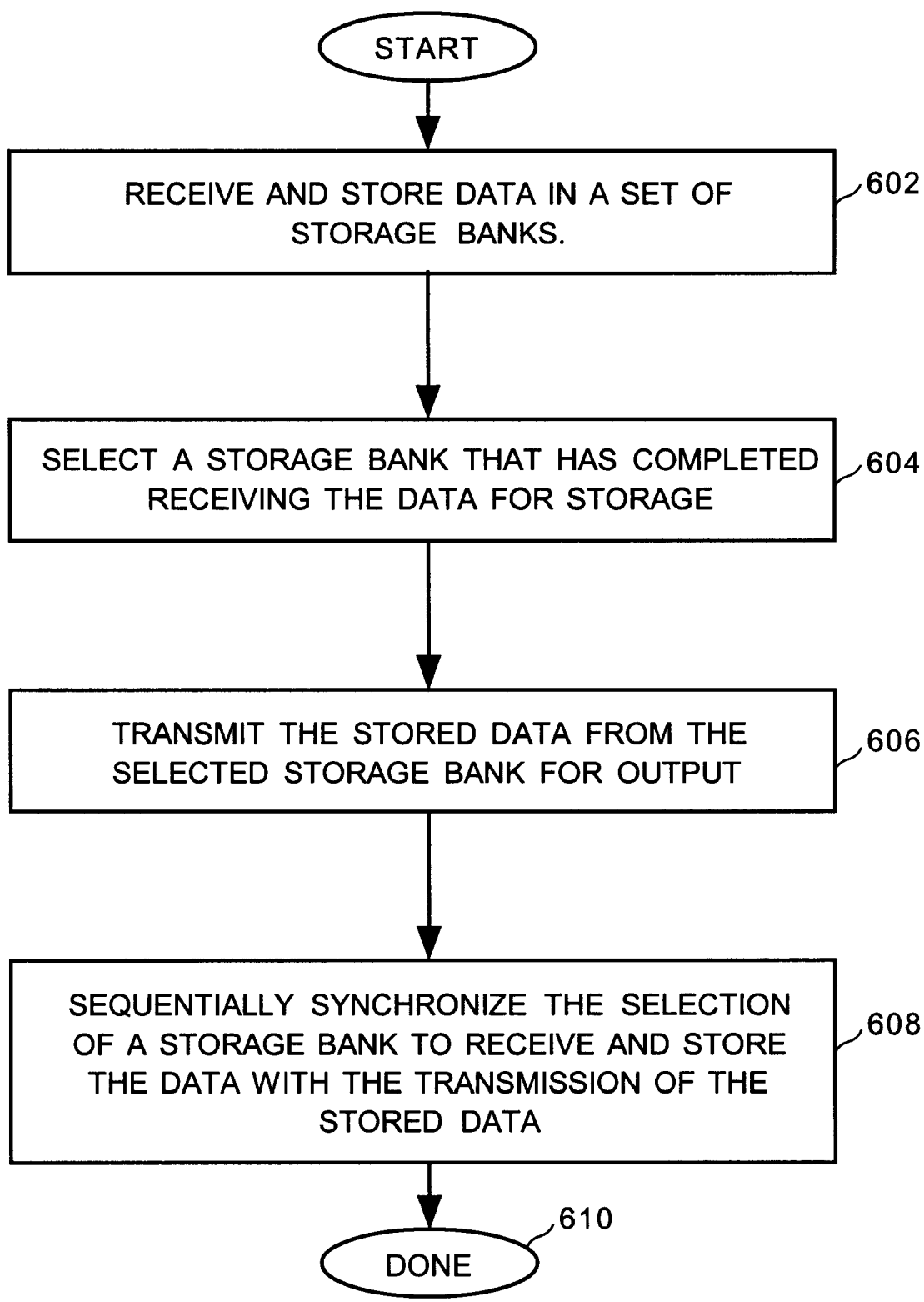
FIG. 6 illustrates a flow chart of a method for synchronously transmitting data in accordance with one embodiment of the present invention.

FIG. 6 illustrates a flow chart of a method for synchronously transmitting data in accordance with one embodiment of the present invention. In operation 602, data from a buffer is sequentially received and stored in a set of storage banks, with each storage bank preferably including two or more storage cells. For example, each storage bank would have 16 or 32 storage cells for storing 16 or 32 bits of data. Each storage bank may optionally include additional storage cells for error detection or error correction bits. Then in operation 604, a set of enable signals are generated to select a storage bank that has completed receiving the data for storage. The enable signals are adapted to sequentially select the storage banks for transmitting the stored data. Next in operation 606, the stored data from the selected storage bank is transmitted for output in response to the set of enable signals. In one embodiment, one or more multiplexers would receive the enable signals to selectively transmit the stored data from the selected storage bank.

In operation 608, the selection of a storage bank to receive and store the data is sequentially synchronized with the transmission of the stored data such that when one storage bank is receiving and storing the data, the stored data from another storage bank is transmitted. For example, the data is received and stored in multiples of 8 bits, and the data is transmitted in multiples of 8 bits. Alternatively, the data includes additional error detection or error correction bits that would be received and stored with the data bits, and then transmitted with the data bits. The method then terminates in operation 610.

By thus synchronizing the reception and transmission of data, the present invention allows a higher rate of data communication. In addition, the higher data transmission rate eliminates the need for generating and transmitting NOT_READY signals to the processor. This allows more efficient use of the processor by reducing wait states in transferring data.

While the present invention has been described in terms of several preferred embodiments, there are alterations, permutations, and equivalents which fall within the scope of this invention. It should also be noted that there are alternative ways of implementing both the method, device, and system of the present invention. It is therefore intended that the following appended claims be interpreted as including all such alterations, permutations, and equivalents as fall within the true spirit and scope of the present invention.

What is claimed is:

1. A circuit for synchronizing data communication using a set of storage banks, comprising:
   a set of storage banks arranged to store data for transmission;
   enable circuitry for generating a set of enable signals, which are adapted to select a storage bank that has completed receiving the data for storage, the enable circuitry generating the set of enable signals to sequentially select the storage banks for transmitting the stored data; and
   synchronization circuitry for synchronizing the selection of a storage bank to receive and store the data with the generation of the enable signals to transmit the stored data, the synchronization circuitry being configured to select the storage banks sequentially one after another and the synchronization circuitry includes a set of synchronization sub-circuits, each of which is configured to receive one of the enable signals.

2. The circuit recited in claim 1, wherein the synchronization sub-circuits are configured to generate a plurality of logic signals, each synchronization sub-circuit generating one logic signal, wherein the logic signals are provided to the enable circuitry for generating one of the enable signals.

3. The circuit recited in claim 2, wherein the synchronization sub-circuits generate a plurality of read synchronization signals, one read synchronization signal for each storage bank, wherein the read synchronization signals are used to sequentially select the storage banks, one after another, for receiving and storing the data.

4. The circuit recited in claim 3, wherein each of the synchronization sub-circuits includes a series of flip-flops and a combinational logic gate.

5. The circuit recited in claim 2, wherein the enable circuitry includes a set of enable sub-circuits, each of which is configured to receive a plurality of the logic signals from a plurality of the synchronization sub-circuits.

6. The circuit recited in claim 5, wherein each of the enable sub-circuits includes one or more combinational logic gates.

7. An interface circuit for synchronously transmitting data from a first device to a second device, comprising:
   a set of storage banks for receiving and storing data, each storage bank, the storage banks being configured to transmit the stored data;
   a multiplexer coupled to receive the data from the set of storage banks and a set of enable signals, the multiplexer selecting a storage bank in response to the set of enable signals such that the multiplexer transmits the data from the selected storage bank for output;
   enable circuitry configured to generate the set of enable signals for selecting a storage bank that has completed receiving the data for storage, the enable circuitry generating the set of enable signals to sequentially select the storage banks for transmitting the stored data; and
   synchronization circuitry for synchronizing the selection of a storage bank to receive and store the data with the generation of the enable signals to transmit the stored data, the synchronization circuitry being configured to select the storage banks sequentially one after another and the synchronization circuitry includes a set of synchronization sub-circuits, each of which is configured to receive one of the enable signals.

8. The interface circuit recited in claim 7, wherein the synchronization sub-circuits are configured to generate a plurality of logic signals, each synchronization sub-circuit generating one logic signal, wherein the logic signals are provided to the enable circuitry for generating one of the enable signals.

9. The interface circuit recited in claim 8, wherein the synchronization sub-circuits generate a plurality of read synchronization signals, one read synchronization signal for each storage bank, wherein the read synchronization signals are used to sequentially select the storage banks, one after another, for receiving and storing the data.

10. The interface circuit recited in claim 9, wherein each of the synchronization sub-circuits includes a series of flip-flops and a combinational logic gate.

11. The interface circuit recited in claim 8, wherein the enable circuitry includes a set of enable sub-circuits, each of which is configured to receive a plurality of the logic signals from a plurality of the synchronization sub-circuits.

12. The interface circuit recited in claim 11, wherein each of the enable sub-circuits includes one or more combinational logic gates.

13. The interface circuit recited in claim 7, further comprising:

a latch for latching the transmitted data from the output of the multiplexer.

14. A method for synchronously transmitting data from a first device to a second device, comprising:

receiving and storing data in a set of storage banks, each storage bank including a plurality of storage cells, the storage banks being configured to transmit the stored data;

generating a set of enable signals to select a storage bank that has completed receiving the data for storage, the set of enable signals being adapted to sequentially select the storage banks for transmitting the stored data;

transmitting the stored data from the selected storage bank for output in response to the set of enable signals; and sequentially synchronizing the selection of a storage bank to receive and store the data with the transmission of the stored data such that when one storage bank is receiving and storing the data, the stored data from another storage bank is transmitted, the sequentially synchronizing includes outputting a plurality of logic signals for generating the set of enable signals.

15. The method recited in claim 14, wherein the operation of sequentially synchronizing includes:

generating a plurality of read synchronization signals, one read synchronization signal for each storage bank; and sequentially selecting the storage banks, one after another, for receiving and storing the data in response to the read synchronization signals.

16. The method recited in claim 15, wherein each of the set of enable signals is generated in response to a set of the logic signals.

17. The method recited in claim 15, wherein the read synchronization signals are generated by cascading a series of flip-flops and a logic gate.

18. The method recited in claim 14, further comprising:

storing the transmitted data from the selected storage bank.

* * * * *